(12) United States Patent
Castillo Buenaventura et al.

(10) Patent No.: US 11,940,497 B2
(45) Date of Patent: Mar. 26, 2024

(54) MONITORING OF MAGNETIC SENSING ELEMENTS OF A SWITCHING DEVICE

(71) Applicant: Schneider Electric Industries SAS, Rueil Malmaison (FR)

(72) Inventors: Felipe Castillo Buenaventura, Angoulême (FR); Gregory Molina Mendoza, Ruelle-sur-Touvre (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 16 days.

(21) Appl. No.: 17/750,596

(22) Filed: May 23, 2022

(65) Prior Publication Data

US 2022/0381826 A1    Dec. 1, 2022

(30) Foreign Application Priority Data

May 31, 2021    (EP) .................................. 21305719

(51) Int. Cl.

| | |
|---|---|
| *G01R 31/00* | (2006.01) |
| *G01R 31/327* | (2006.01) |
| *H01H 47/00* | (2006.01) |
| *H01H 50/16* | (2006.01) |

(52) U.S. Cl.
CPC ......... *G01R 31/327* (2013.01); *H01H 47/002* (2013.01); *H01H 50/16* (2013.01)

(58) Field of Classification Search
CPC .............................. G01R 31/00; G01R 31/327
USPC .................................................. 324/415, 424
See application file for complete search history.

(56) References Cited

U.S. PATENT DOCUMENTS

| | | | |
|---|---|---|---|
| 2016/0172136 A1 | 6/2016 | McGaffey et al. | |
| 2020/0016410 A1* | 1/2020 | Min | A61N 1/36521 |
| 2021/0199736 A1* | 7/2021 | O'Brien | G01R 33/3678 |

FOREIGN PATENT DOCUMENTS

| | | | | |
|---|---|---|---|---|
| CA | 2865152 A1 * | 3/2015 | ............ | H01H 13/14 |
| EP | 2562782 A1 | 2/2013 | | |
| EP | 3068052 A1 | 9/2016 | | |

OTHER PUBLICATIONS

Extended European Search Report dated Nov. 5, 2021 for corresponding European Patent Application No. EP21305719.3, 9 pages.

* cited by examiner

*Primary Examiner* — Vincent Q Nguyen
(74) *Attorney, Agent, or Firm* — Locke Lord LLP

(57) ABSTRACT

A switching device includes a header, first and second magnets, first and second inductors, and a first magnetic sensing element aligned with the first magnet and the first inductor and a second magnetic sensing element aligned with the second magnet and the second inductor. The switching device further includes a printed circuit board (PCB) including an upper face on which are mounted the first and second magnetic sensing elements and a lower face on which are mounted the first and second inductors. When the switching device is operated, the header is pressed towards the PCB, the first and second magnets get closer respectively to the first and second magnetic sensing elements, which increases the magnetic flux through the magnetic sensing elements and changes the status of the switching device when a threshold is reached. The PCB further includes first and second microcontrollers configured to determine a state of the switching device.

10 Claims, 3 Drawing Sheets

MONITORING OF MAGNETIC SENSING ELEMENTS OF A SWITCHING DEVICE

FIELD OF INVENTION

The present disclosure relates generally to switching devices, more especially to the monitoring of elements of switching devices.

BACKGROUND

Switching devices typically refer to any device that makes or breaks an electrical circuit. Electrical switching devices all consist of sets of contacts that open and close when the device is activated. Switching devices are operated in a variety of ways, from the simplest of which are manual switches such as the domestic light switch to more complex switches used in industrial applications. In such cases, switching devices can be operated using an electromagnetic coil as inductor element with magnetic sensing elements to activate the switch.

Examples of such applications include, but are not limited to, commercial aviation, space flight, military applications and industrial processes, where redundancy measures are demanded to ensure continued performance of equipment in the event of a partial failure. Such stringent requirements are demanded because of the potential consequences of failure.

There is therefore a need for a switching device having high reliability and high diagnostic coverage, able to check the correct operation of the magnetic sensing elements of the switching device.

SUMMARY

This summary is provided to introduce concepts related to the present inventive subject matter. This summary is not intended to identify essential features of the claimed subject matter nor is it intended for use in determining or limiting the scope of the claimed subject matter.

In one implementation, there is provided a switching device comprising:
 a header
 a first magnet and a second magnet,
 a first magnetic sensing element and a second magnetic sensing element,
 a first inductor and a second inductor,
 a printed circuit board comprising an upper face on which are mounted upfront the first magnetic sensing element and the second magnetic sensing element and a lower face on which are mounted upfront the first inductor and the second inductor,
 a first microcontroller unit and a second microcontroller unit,
 wherein the first microcontroller unit and the second microcontroller unit are configured to send a stimulus signal respectively to the second conductor and to the first conductor,
 wherein the first microcontroller unit is configured to read a response produced by the first magnetic sensing element, the response containing a set of values of a magnetic field produced by the first inductor having received the stimulus signal sent by the second microcontroller unit,
 wherein the second microcontroller unit is configured to read a response produced by the second magnetic sensing element, the response containing a set of values of a magnetic field produced by the second inductor having received the stimulus signal sent by the first microcontroller unit,
 wherein the first microcontroller unit and the second microcontroller unit are configured to determine a state of the switching device based on the read responses.

The switching device allows seamlessly performing a crossed input monitoring of magnetic sensing elements in a redundant input channel configuration, which significantly improves the input diagnostic coverage of redundant input switching devices. The switching device presents a cost-effective solution to obtain highly reliable switching device, suitable for short and large cycle times.

Advantageously, the arrangement allows a simple and compact verification system that can be fitted in many applications such as push buttons and selectors but also extended to any application that requires highly reliable switching devices.

In an embodiment, when the switching device is operated, the header is pressed towards the printed circuit board, the first magnet and the second magnet get closer respectively to the first magnetic sensing element and the second magnetic sensing element, which increases the magnetic flux through the magnetic sensing elements and changes the status of the switching device if a threshold is reached.

In an embodiment, the state of the switching device is determined by a voting process by the first microcontroller unit and the second microcontroller unit based on the read responses.

In an embodiment, the first microcontroller unit and the second microcontroller unit checks respectively the consistency between the stimulus signal sent by the first microcontroller unit and the set of values of the magnetic field produced by the second inductor and the consistency between the stimulus signal sent by the second microcontroller unit and the set of values of the magnetic field produced by the first inductor.

In an embodiment, the stimulus signal is a static magnetic field that is induced by the first inductor or the second inductor and the set of values of the response produced by the first magnetic sensing element or the second magnetic sensing element corresponds to a steady value.

In an embodiment, the stimulus signal is a dynamic magnetic field that is induced by the first inductor or the second inductor and the set of values of the response produced by the first magnetic sensing element (MSE1) or the second magnetic sensing element corresponds to an oscillating signal.

In an embodiment, the first magnetic sensing element is aligned with the first magnet and the first inductor and the second magnetic sensing element is aligned with the second magnet and the second inductor.

In an embodiment, the first microcontroller unit and the second microcontroller unit are configured to communicate directly between them.

In an embodiment, if an inconsistency is found in the read responses, one the first microcontroller unit and the second microcontroller unit reports a failure.

In an embodiment, the switching device is part of a push button or a selector.

In another implementation, there is provided a method for monitoring magnetic sensing elements of a switching device comprising a header, a first magnet and a second magnet, a first magnetic sensing element and a second magnetic sensing element, a first inductor and a second inductor, a printed circuit board comprising an upper face on which are mounted upfront the first magnetic sensing element and the second magnetic sensing element and a lower face on which are mounted upfront the first inductor and the second inductor, a first microcontroller unit and a second microcontroller unit, the method comprising:

the first microcontroller unit and the second microcontroller unit sending a stimulus signal respectively to the second conductor and to the first conductor, the first microcontroller unit reading a response produced by the first magnetic sensing element, the response corresponding to a magnetic field produced by the first inductor having received the stimulus signal sent by the second microcontroller unit, the second microcontroller unit reading a response produced by the second magnetic sensing element, the response corresponding to a magnetic field produced by the second inductor (EM2) having received the stimuli signal sent by the first microcontroller unit, the first microcontroller unit and the second microcontroller unit determining a state of the switching device based on the read responses.

In another implementation there is provided a computer-readable medium having embodied thereon a computer program for monitoring magnetic sensing elements of a switching device. Said computer program comprises instructions which carry out steps according to the method according to the invention.

BRIEF DESCRIPTION OF THE FIGURES

The detailed description is described with reference to the accompanying figures. In the figures, the left-most digit(s) of a reference number identifies the figure in which the reference number first appears. The same numbers are used throughout the figures to reference like features and components. Some embodiments of system and/or methods in accordance with embodiments of the present subject matter are now described, by way of example only, and with reference to the accompanying figures, in which.

The same reference number represents the same element or the same type of element on all drawings.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

DESCRIPTION OF EMBODIMENTS

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention, and are to be construed as being without limitation to such specifically recited examples and conditions. As a result, the invention is not limited to the specific embodiments or examples described below, but by the claims and their equivalents.

Figure 1:
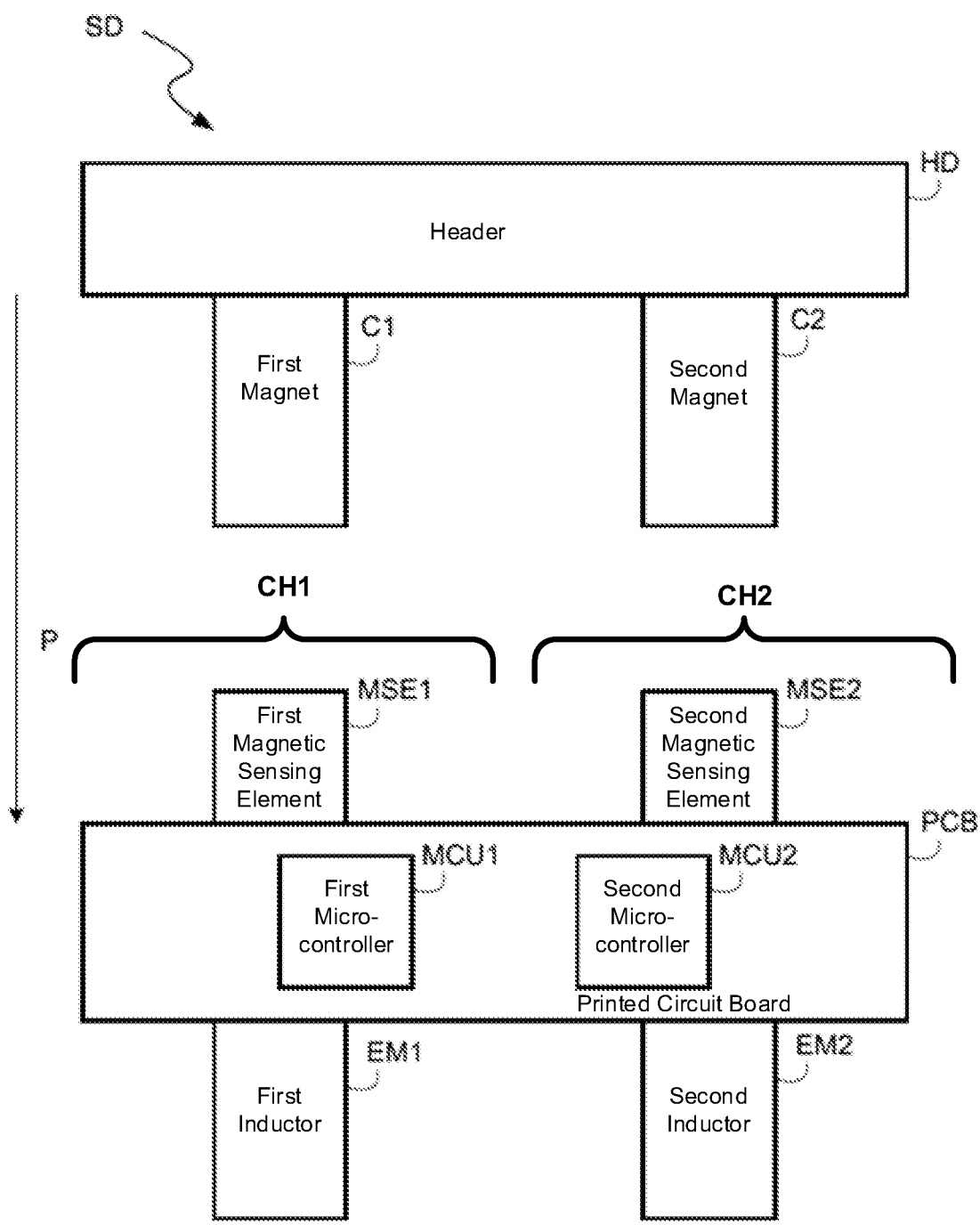
FIG. 1 shows a schematic block diagram of a switching device according to one embodiment.

Referring to FIG. 1, a switching device SD comprises a header HD, a printed circuit board PCB, a first magnet C1 and a second magnet C2, a first magnetic sensing element MSE1 and a second magnetic sensing element MSE2, a first inductor EM1 and a second inductor EM2.

The printed circuit board PCB comprises an upper face on which are mounted upfront the first magnetic sensing element MSE1 and the second magnetic sensing element MSE2 and a lower face on which are mounted upfront the first inductor EM1 and the second inductor EM2.

The printed circuit board PCB further comprises a first microcontroller MCU1 and a second microcontroller MCU2 able to communicate between them. At least one of the first microcontroller MCU1 and a second microcontroller MCU2 is able to communicate to an interface of a host computing unit that can take action based on feedback provided by one of the first microcontroller MCU1 and second microcontroller MCU2.

It is assumed that the first magnetic sensing element MSE1 is well aligned with the first magnet C1 and the first inductor EM1, and that the second magnetic sensing element MSE2 is well aligned with the second magnet C2 and the second inductor EM2. With this architecture, the first magnetic sensing element MSE1 and the second magnetic sensing element MSE2 can be excited respectively by the first magnet C1 and the second magnet C2 and the first inductor EM1 and the second inductor EM2.

It is considered that the set composed of the first magnetic sensing element MSE1, the first microcontroller MCU1 and the first inductor EM1 forms a first channel CH1 to be tested and that the set composed of the second magnetic sensing element MSE2, the second microcontroller MCU2 and the second inductor EM2 forms a second channel CH2 to be tested. The architecture is thus defined with two completely independent channels that can be tested.

When the switching device is operated, by a human for example, the header is pressed towards direction P, i.e. towards the printed circuit board, the first magnet C1 and the second magnet C2 get closer respectively to the first magnetic sensing element MSE1 and the second magnetic sensing element MSE2 which by magnetism principles, increases the magnetic flux through the magnetic sensing elements and changes the status of the switching device if a threshold is reached. This implies that the status of the switching device relates to the magnitude of the magnetic field. When a DC current passes through an inductor EM1 or EM2, a magnetic flux is induced and measurable by the corresponding magnetic sensing element MSE1 or MSE2.

In one embodiment, the switching device is part of a button like a push button or a selector. In all cases, an action of an operator on the button (a push or a rotation of the button) will lead to a translation of the header and the magnet towards the magnetic sensing elements.

Figure 2:
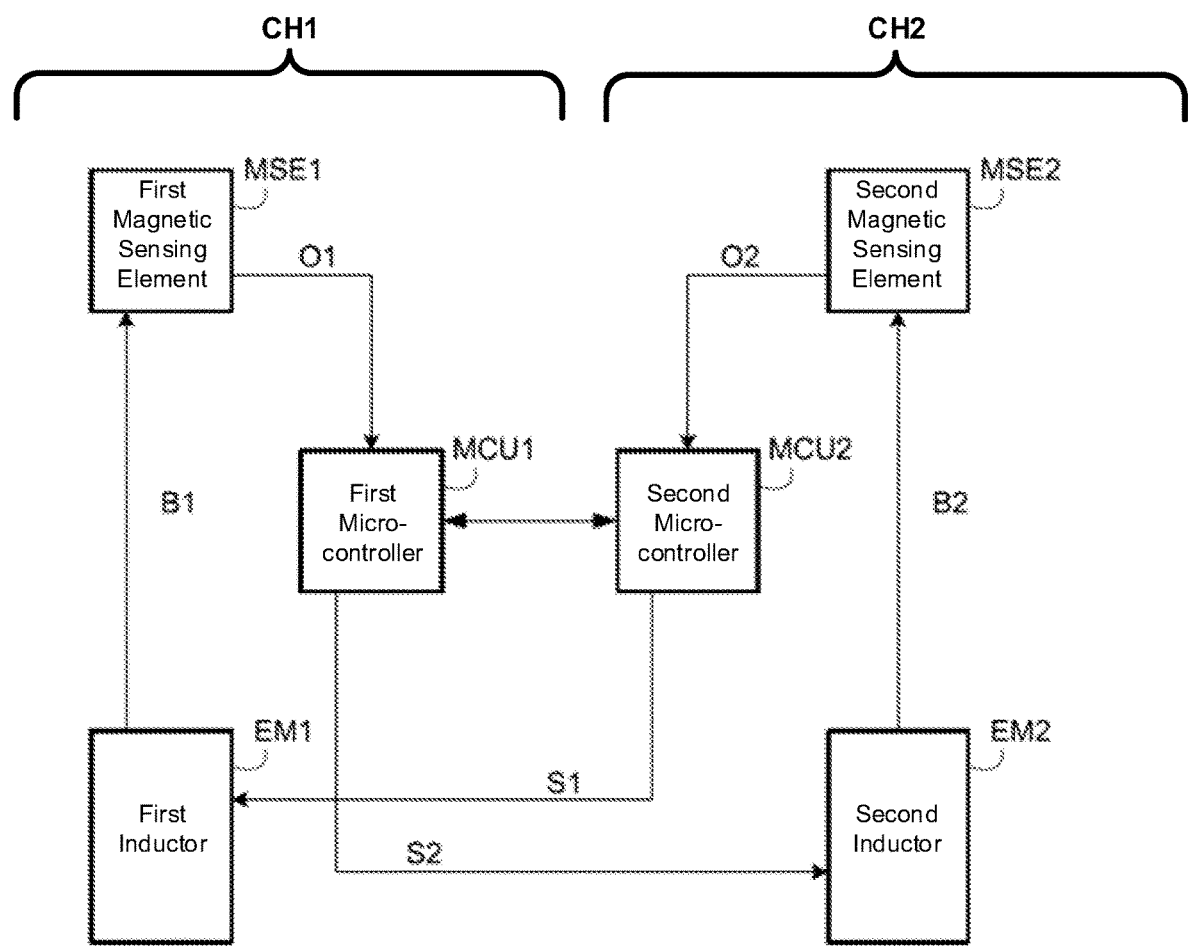
FIG. 2 illustrates a crossed input monitoring routine in the switching device according to one embodiment.

Referring to FIG. 2, a crossed input monitoring procedure in the switching device is described according to one embodiment, by testing for example firstly the second channel CH2 and then the first channel CH1.

The first microcontroller MCU1 informs the second microcontroller MCU2 through the communication bus that the second channel CH2 will be tested. The second microcontroller MCU2 acknowledges the incoming test and waits for stimulus.

The first microcontroller MCU1 sends a stimulus signal S2 to the second inductor EM2 that produces a magnetic field B2.

The second magnetic sensing element MSE2 reads the value of the magnetic field B2 and produces a response O2 than can be read by the second microcontroller MCU2.

The second microcontroller MCU2 sends the value of the magnetic field B2 to the first microcontroller MCU1 through the communication bus.

The first microcontroller MCU1 checks the consistency between the stimulus signal sent and the value of the magnetic field B2. When producing the stimulus signal, the first microcontroller MCU1 is expecting a set of defined values of magnetic field produced by the second inductor. The first microcontroller MCU1 defines an electrical signal depending on the properties of the second inductor. Thus when the electrical signal is produced by the first microcontroller MCU1, it will act as a stimulus signal for the second inductor that transforms it into a magnetic field having a specific behavior according to the properties of the second inductor.

In a redundant and similar manner, the first channel CH1 has to be tested like the second channel previously.

The second microcontroller MCU2 informs the first microcontroller MCU1 through the communication bus that the first channel CH1 will be tested. The first microcontroller MCU2 acknowledges the incoming test and waits for stimulus signal.

The second microcontroller MCU2 sends a stimulus signal S1 to the first inductor EM1 that produces a magnetic field B1.

The first magnetic sensing element MSE1 reads the value of the magnetic field B1 and produces a response O1 than can be read by the first microcontroller MC1.

The first microcontroller MCU1 sends the value of the magnetic field B1 to the second microcontroller MCU2 through the communication bus.

The second microcontroller MCU2 checks the consistency between the stimulus signal sent and the value of the magnetic field B1.

After the crossed input monitoring procedure, the state retrieval of each input is independently done by each channel. Once both retrievals have been done, a voting process to determine the state of the switching device is performed. During the voting process, both microcontrollers exchange the information of state of switching device, the result of the crossed input monitoring and all internal diagnostics. If all the results are consistent, then the retrieved state of the switching device is transmitted to a control system. If any of the cross-input monitoring results has failed, a diagnostic will be raised describing the defective channel and the switching device will be set in fail state.

In one embodiment, the stimulus signal can be set with two different approaches: static or dynamic. In a static approach, a steady magnetic field is induced by the inductor which then can be sensed by the magnetic sensing element continuously. In the static approach it may be difficult to differentiate the magnetic field coming from the magnets and the magnetic field coming from the inductors since both are static. In a dynamic approach the sensor can be diagnosed without overlapping with the position measurement. For example, a dynamic stimulus signal could be an oscillating signal which frequency is detected by the microcontroller instead of a threshold. This enables the microcontroller to discriminate natively the magnetic field of the inductor from the magnetic field of the magnets.

There are two embodiments of operating the stimulus signal of the crossed input monitoring as described before.

In a first embodiment, the microcontrollers open a time window during the cycle time of the switching device in order to perform the complete crossed input monitoring. In this mode, the complete process of monitoring is launched from beginning to end. It implies that the stimulus signal is applied and removed between two readings of the switching device state. It is assumed that the monitoring procedure must be much faster than the intended cycle time to receive the state of the switching device.

In a second embodiment, the microcontrollers set a stimulus signal over many cycle times of the switching device. This implies that the stimulus signal must not disturb the reading of the switching device status. With this approach a magnetic field offset is set to the reading of the magnetic sensor which can be verified by the microcontrollers. This approach is suitable when the response time of the monitoring system is greater or comparable to the switching device cycle time.

Figure 3:
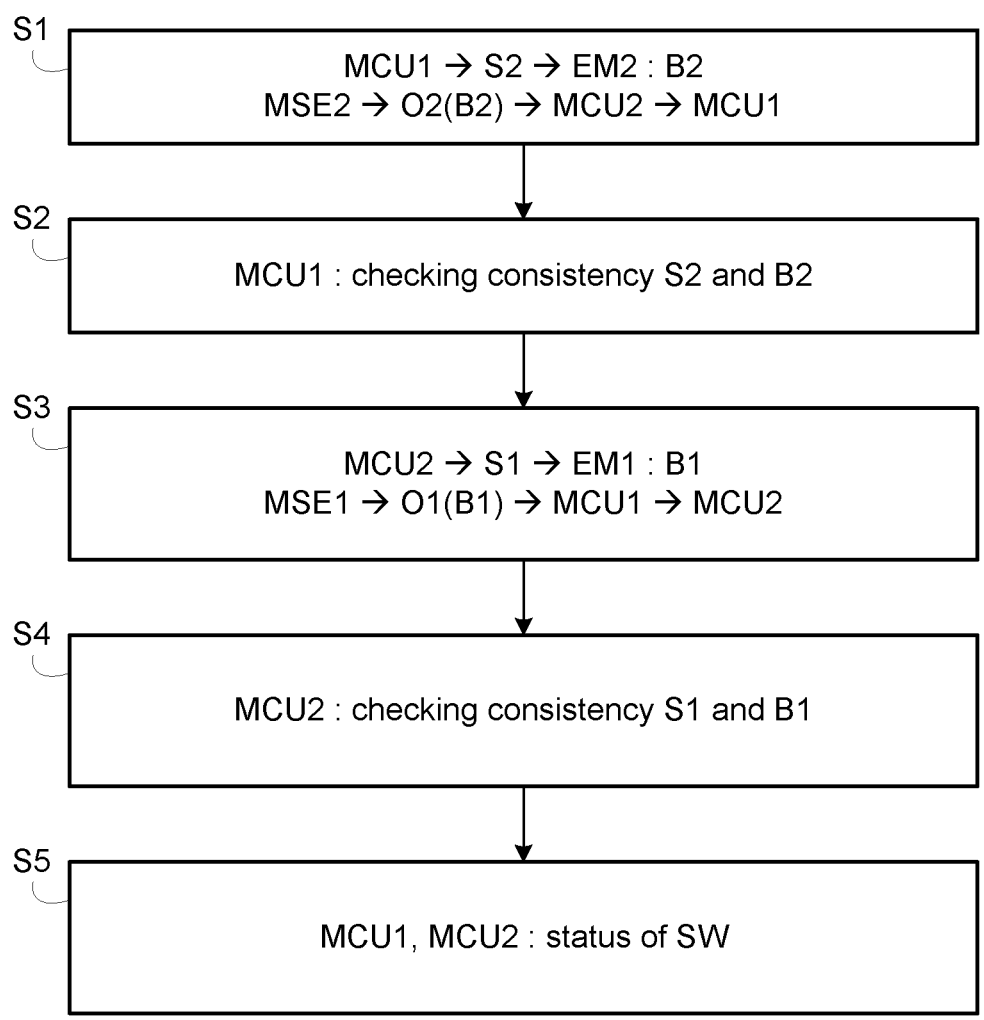
FIG. 3 is a flow diagram of a method for a crossed input monitoring of magnetic sensing elements of a switching device according to one embodiment.

With reference to FIG. 3, a method for monitoring of magnetic sensing elements of a switching device according to one embodiment of the invention comprises steps S1 to S5.

In step S1, the first microcontroller unit MCU1 sends a stimulus signal S2 to the second inductor EM2 that produces a magnetic field B2.

The second magnetic sensing element MSE2, that is near and aligned with the second inductor EM2, retrieves a set of values of the magnetic field B2 and produces a response O2 containing the set of values of the magnetic field B2.

The second microcontroller MCU2 reads the response and send this latter to the first microcontroller MCU1.

In step S2, the first microcontroller MCU1 checks consistency between the stimulus signal S2 and the set of values of the magnetic field B2. If the consistency is correct, the reading of the magnetic field B2 is declared reliable.

In step S3, the second microcontroller unit MCU2 sends a stimulus signal S1 to the first inductor EM1 that produces a magnetic field B1.

The first magnetic sensing element MSE1, that is near and aligned with the first inductor EM21, retrieves a set of values of the magnetic field B1 and produces a response O1 containing the set of values of the magnetic field B1.

The second microcontroller MCU2 reads the response and send this latter to the first microcontroller MCU1.

In step S4, the second microcontroller MCU2 checks consistency between the stimulus signal S1 and the set of values of the magnetic field B1. If the consistency is correct, the reading of the magnetic field B1 is declared reliable.

Steps S1-S2 and S3-S4 can be inverted or executed substantially in parallel.

If the stimulus signal S1, S2 corresponds to a static magnetic field, the set of values of the response produced by the destined magnetic sensing element corresponds to a steady value. If the stimulus signal S1, S2 corresponds to a dynamic magnetic field, the set of values of the response produced by the destined magnetic sensing element corresponds to varying values like an oscillating signal.

In step S5, the first microcontroller MCU1 and the second microcontroller MCU2 execute "voting process" of the state of each channel to report the status of the switching device. If the readings of each channel are declared reliable, the state of the switching device is reported as operational. If an inconsistency is found during the channel tests, the switching device is reported in failure.

In one embodiment, if an inconsistency is found, one the first microcontroller unit MCU1 and the second microcontroller unit MCU2 raises a diagnostic routine.

Although the present invention has been described above with reference to specific embodiments, it is not intended to be limited to the specific form set forth herein. Rather, the invention is limited only by the accompanying claims and, other embodiments than the specific above are equally possible within the scope of these appended claims.

Furthermore, although exemplary embodiments have been described above in some exemplary combination of components and/or functions, it should be appreciated that, alternative embodiments may be provided by different combinations of members and/or functions without departing from the scope of the present disclosure. In addition, it is specifically contemplated that a particular feature described, either individually or as part of an embodiment, can be combined with other individually described features, or parts of other embodiments

The invention claimed is:

1. A switching device comprising:
a header,
a first magnet and a second magnet,
a first inductor and a second inductor,
a first magnetic sensing element aligned with the first magnet and the first inductor and a second magnetic sensing element aligned with the second magnet and the second inductor,
a printed circuit board comprising an upper face on which are mounted upfront the first magnetic sensing element and the second magnetic sensing element and a lower face on which are mounted upfront the first inductor and the second inductor,
wherein when the switching device is operated, the header is pressed towards the printed circuit board, the first magnet and the second magnet get closer respectively to the first magnetic sensing element and the second magnetic sensing element, which increases the magnetic flux through the magnetic sensing elements and changes the status of the switching device when a threshold is reached,
the printed circuit board further comprising a first microcontroller unit and a second microcontroller unit,
wherein the first microcontroller unit and the second microcontroller unit are configured to send a stimulus signal respectively to the second inductor and to the first inductor,
wherein the first microcontroller unit is configured to read a response produced by the first magnetic sensing element, the response containing a set of values of a magnetic field produced by the first inductor when the first inductor receives the stimulus signal sent by the second microcontroller unit,
wherein the second microcontroller unit is configured to read a response produced by the second magnetic sensing element, the response containing a set of values of a magnetic field produced by the second inductor when the second inductor receives the stimulus signal sent by the first microcontroller unit,
wherein the first microcontroller unit and the second microcontroller unit are configured to determine a state of the switching device based on the read responses.

2. The switching device according to claim 1, wherein the state of the switching device is determined by a voting process by the first microcontroller unit and the second microcontroller unit based on the read responses.

3. The switching device according to claim 1, wherein the first microcontroller unit and the second microcontroller unit checks respectively the consistency between the stimulus signal sent by the first microcontroller unit and the set of values of the magnetic field produced by the second inductor and the consistency between the stimulus signal sent by the second microcontroller unit and the set of values of the magnetic field produced by the first inductor.

4. The switching device according to claim 1, wherein the stimulus signal is a static magnetic field that is induced by the first inductor or the second inductor and the set of values of the response produced by the first magnetic sensing element or the second magnetic sensing element corresponds to a steady value.

5. The switching device according to claim 1, wherein the stimulus signal is a dynamic magnetic field that is induced by the first inductor or the second inductor and the set of values of the response produced by the first magnetic sensing element or the second magnetic sensing element corresponds to varying values.

6. The switching device according to claim 1, wherein the first microcontroller unit and the second microcontroller unit are configured to communicate directly between them.

7. The switching device according to claim 1, wherein when an inconsistency is found in the read responses, one the first microcontroller unit and the second microcontroller unit reports a failure.

8. The switching device according to claim 1, being part of a push button or a selector.

9. A method for monitoring magnetic sensing elements of a switching device comprising a header, a first magnet and a second magnet, a first magnetic sensing element aligned with the first magnet and the first inductor and a second magnetic sensing element aligned with the second magnet and the second inductor, a first inductor and a second inductor, a printed circuit board comprising an upper face on which are mounted upfront the first magnetic sensing element and the second magnetic sensing element and a lower face on which are mounted upfront the first inductor and the second inductor, wherein when the switching device is operated, the header is pressed towards the printed circuit board, the first magnet and the second magnet get closer respectively to the first magnetic sensing element and the second magnetic sensing element, which increases the magnetic flux through the magnetic sensing elements and changes the status of the switching device when a threshold is reached, the printed circuit board further comprising a first microcontroller unit and a second microcontroller unit, the method comprising:
the first microcontroller unit and the second microcontroller unit sending a stimulus signal respectively to the second inductor and to the first inductor,
the first microcontroller unit reading a response produced by the first magnetic sensing element, the response corresponding to a magnetic field produced by the first inductor when the first inductor receives the stimulus signal sent by the second microcontroller unit,
the second microcontroller unit reading a response produced by the second magnetic sensing element, the response corresponding to a magnetic field produced by the second inductor when the second inductor receives the stimulus signal sent by the first microcontroller unit,
the first microcontroller unit and the second microcontroller unit determining a state of the switching device based on the read responses.

10. A non-transitory computer-readable medium having embodied thereon a computer program for executing the method for monitoring magnetic sensing elements of a switching device according to claim 9.

* * * * *